United States Patent
Liu et al.

(10) Patent No.: US 6,323,123 B1
(45) Date of Patent: Nov. 27, 2001

(54) LOW-K DUAL DAMASCENE INTEGRATION PROCESS

(75) Inventors: Chih-Chien Liu, Taipei; Cheng-Yuan Tsai, Yun-Lin County; Anseime Chen; Ming-Sheng Yang, both of Hsin-Chu, all of (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/655,957

(22) Filed: Sep. 6, 2000

(51) Int. Cl.[7] .............................................. H01L 21/4763
(52) U.S. Cl. ................................................................ 438/638
(58) Field of Search ..................................... 438/638, 622, 438/623, 634, 700, 706, 738

(56) References Cited

U.S. PATENT DOCUMENTS

| | | | |
|---|---|---|---|
| 6,197,681 | * | 3/2001 | Liu et al. .............................. 438/637 |
| 6,204,168 | * | 3/2001 | Naik et al. ............................ 438/638 |
| 6,211,092 | * | 4/2001 | Tang et al. ............................ 438/719 |

* cited by examiner

Primary Examiner—David Nelms
Assistant Examiner—Quoc Hoang

(74) Attorney, Agent, or Firm—Powell, Goldstein, Frazer & Murphy LLP

(57) ABSTRACT

A barrier layer is formed over the substrate by deposition, and a first dielectric is formed over the diffusion barrier layer by deposition. A etching stop layer and a second dielectric are formed in turn over the first dielectric by deposition. Next, a hard mask is formed on the second dielectric. Then, a photoresist layer is formed over the hard mask, and defining the photoresist layer. And then dry etching is carried out by means of the photoresist layer as the mask to form a via hole. A gap-filling material is filled on the second dielectric and into the via hole by conventional partial-cured (or un-cured) spin-on glass method. A anti-reflection layer is formed over the second dielectric by deposition. Another photoresist layer is formed on the anti-reflection coating and defined the photoresist layer, and to expose the partial surface of the via hole and the anti-reflection coating. Dry etching is proceed by means of the photoresist layer as a mask, and etching stop layer is as a etching terminal point to remove exposed partial surface of the bottom anti-reflection coating so as to form a trench. Then, the gap-filling material is removed by wet etching. Then a barrier layer is formed, and the seed layer is deposition on the barrier layer, and forming a conduct electricity metal layer on the seed layer. And then, the barrier layer and the anti-reflection coating are removed. Final, a barrier layer is deposition again.

19 Claims, 8 Drawing Sheets

LOW-K DUAL DAMASCENE INTEGRATION PROCESS

BACKGROUND OF THE INVENTION

1. Field of the Invention

The present invention relates generally to a method for manufacturing the multi level interconnects of semiconductor devices, and more particularly to an integration process of a low-K dual damascene.

2. Description of the Prior Art

When semiconductor devices of integrated circuit (IC) become highly integrated, the surface of the chips can be not supplied with enough area to make the interconnects. For matching up the requirement of interconnects increase with Complementary Metal-Oxide-Semiconductor (CMOS) devices shrinks, many designs of the integrated circuit have to use dual damascene method. Moreover, it is using the three-dimensional structure of multi-level interconnects at present in the deep sub-micron region, and inter-metal dielectric (IMD) as the dielectric material which be used to separate from each of the interconnects. A conducting wire which connects up between the upper and the down metal layers is called the via plug in semiconductor industry. In general, if an opening which forms in the dielectric layer exposure to devices of the substrate in the interconnects, it is called a via.

It has two methods for conventional via and interconnect processes, one method is that via and interconnect finish by oneself, wherein the method is that the dielectric is first formed on the metal layer, and then the photoresist layer (PR) is defined on the dielectric, and use the etching process to make the via, and deposit conduction material in the via by means of deposition to finish the via process, then deposit and define metal layer, final, deposit the dielectric layer whereon. Conventional forming metal interconnect process is that make the via and the interconnect by means of two lithography process. Thus, it is need cumbrous steps of deposit and pattern. And yet, it will result in the interconnect to be difficult patterned due to the multi layer connect layout is more daedal in the sub-quarter micron.

Hence, damascene interconnect structure is developed at present. According to particular of the process, it will compartmentalize three types, such as the single type, the dual type and the self-aligned type. The damascene is a method that etch the trench of the interconnect in the dielectric, and then fill the metal as interconnect. This method can introduce metal that is difficult etched into the semiconductor without etching in the interconnect process. Therefore, this invention is the best method of the interconnect process in the sub-quarter micron.

Conventional dual damascene include two patterns, one is the deep patterns, that is the via patterns; another is the shallow patterns or the line patterns, that is the trench patterns. Referring to FIG. 1A, first of all, a dielectric 12 is formed over on the substrate 10, and a etching stop layer 14 is formed over on the dielectric 12, then a dielectric 16 is formed over on the etching stop layer 14. And then a photoresist layer 18 is formed on the dielectric 16, then the photoresist layer 18 is patterned as a deep pattern area. As show in FIG. 1B, dry etching of the deep patterns is proceeded by means of the photoresist layer 18 as a mask, then punch through the dielectric 16, etching stop layer 14 and the dielectric 12, and forming a via hole, then remove the photoresist layer 18. As show in FIG. 1C, a photoresist layer 22 is formed on the dielectric 16 by deposition, and it is defined to form a shallow pattern area, and the partial surface of the via 20 and the dielectric 16 are exposed, likewise, the horizontal size of the shallow patterns is large more then one of the deep patterns. As show in FIG. 1D, dry etching of the shallow patterns is proceed by means of the photoresist layer 22 as a mask, and exposed partial surface of the dielectric 16 is removed to form a trench 24 having large horizontal size to take advantage of etching stop layer 14 is as a etching terminal point. As show in FIG. 1E, the photoresist layer 22 is removed to form the opening of the damascene 20, 24. Final, proceed a interconnect process, since the above processes are well known in the prior art, which are not the focus of the present invention, hence will not be described in greater details.

The skill of the dual damascene is a method for forming the via and the interconnects. For dual damascene application, the via fist integration scheme is not as sensitive to the lithographic alignment as the self-aligned scheme. However, when the second photoresist layer is formed, the residue of the photoresist layer will be found in the via. When the second photoresist layer or the residue of the photoresist layer is removed, it will hurt the surface of the low-K material.

In accordance with the above description, a new and improved method for fabricating the low-K dual damascene integration skill is therefore necessary, so as to raise the yield and quality of the follow-up process.

SUMMARY OF THE INVENTION

In accordance with the present invention, a method is provided for fabricating the low-K dual damascene integration skill that substantially overcomes drawbacks of above mentioned problems arised from the conventional methods.

Accordingly, it is an object of the present invention to provide a new method for fabricating the low-K dual damascene process, the present invention use siloxane or methyl siloxane to be as the gap-filling material.

The other object of the present invention is to provide a new method for fabricating the low-K dual damascene process, so as to form the gap-filling material to avoid photoresist layer residue that produced in the via hole. Moreover, the gap-filling material is formed to avoid destroying low-K dielectric while removing the photoresist layer and photoresist residue. Thus, the method of the present invention is effective in raising quality of the process.

Another object of the present invention is that avoid long over etching the bottom of the via and destroying the desire conduct electricity area, so as to fill the gap-filling material in the via hole, and the gap-filling material is easy to remove by dry etching or wet etching after trench etching. Thus, the method of the present invention is easily and to conform to the economic effect, and it is suitable for use in the sub-micron.

A further object of the present invention is that can prevent the low-K materials contact with photoresist layer by fill the via with conventional partial-cured (or un-cured) siloxane (or methyl siloxane) and solve the photoresist rework problem described above.

In accordance with the present invention, a new method for fabricating low-K dual damascene is disclosed. In one embodiment of the present invention, a substrate having copper conduct electricity layers and dielectric layers is provided. First, a copper diffusion barrier layer is formed over the substrate by deposition, and a first inter-metal dielectric is formed over the diffusion barrier layer by deposition. A etching stop layer and a second dielectric are formed in turn over the first dielectric by deposition. Next, a hard mask is formed on the second dielectric. Then, a photoresist layer is formed over the hard mask, and defining the photoresist layer to be a deep pattern area. And then dry etching of the deep pattern is carried out by means of the first photoresist layer as the mask, and punch through in turn the hard mask, the second dielectric layer, the etch stop layer and first dielectric layer to form a via hole, then the photoresist layer and the hard mask are removed. A gap-filling material (such as siloxane or methyl siloxane) is filled on the second dielectric and into the via hole by conventional partial-cured (or un-cured) spin-on glass method (P-SOG). Subsequently, carrying out the etching back to the gap-filling material, and expose the surface of the second dielectric and gap-filling material. A anti-reflection layer (ARL) is formed over the second dielectric by deposition with the anti-reflection coating (ARC) to prevent the glisten of the surface to influence accuracy of the photoresist exposure. On the whole, it is called the top anti-reflection coating (TARC) that the anti-reflection layer (ARL) is formed over the photoresist layer; it is called the bottom anti-reflection coating(BARC )that the anti-reflection layer (ARL) is formed under the photoresist layer. Another photoresist layer is formed on the bottom anti-reflection coating, and the photoresist layer is defined to form a shallow pattern area and to expose the partial surface of the via hole and the bottom anti-reflection coating. Dry etching of the shallow patterns is proceed by means of the photoresist layer as a mask, and etching stop layer is as a etching terminal point to remove exposed partial surface of the bottom anti-reflection coating so as to form a trench having large horizontal size. Then, the gap-filling material is removed by wet etching that can use the aqueous organoamine solution or the buffered oxide etching solution. Subsequently, the photoresist layer is removed to form the opening of the damascene. Next, a barrier layer of the TaN is formed by conformal along the opening of the damascene and to extend over the surface of the second dielectric. Proceeding a interconnect process: first, the seed layer is deposition on the barrier layer of the TaN, and forming a copper conduct electricity metal layer on the copper seed layer by means of electro-chemical deposition. Because the side walls and the bottom of the opening profile of the damascene have the seed layer. The metal layer will can be selectively formed in the opening of the damascene, and only the partial metal layer extend to the surface of the dielectric. A planarization process is carried out by chemical mechanical polishing (CMP) to remove the conduct electricity metal on the second dielectric. And then, the barrier layer of TaN and the bottom anti-reflection coating are removed. Final, a barrier layer of copper is deposition.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Although specific embodiments have been illustrated and described, it will be obvious to those skilled in the art that various modifications may be made without departing from what is intended to be limited solely by the appended claims.

Figure 1A:
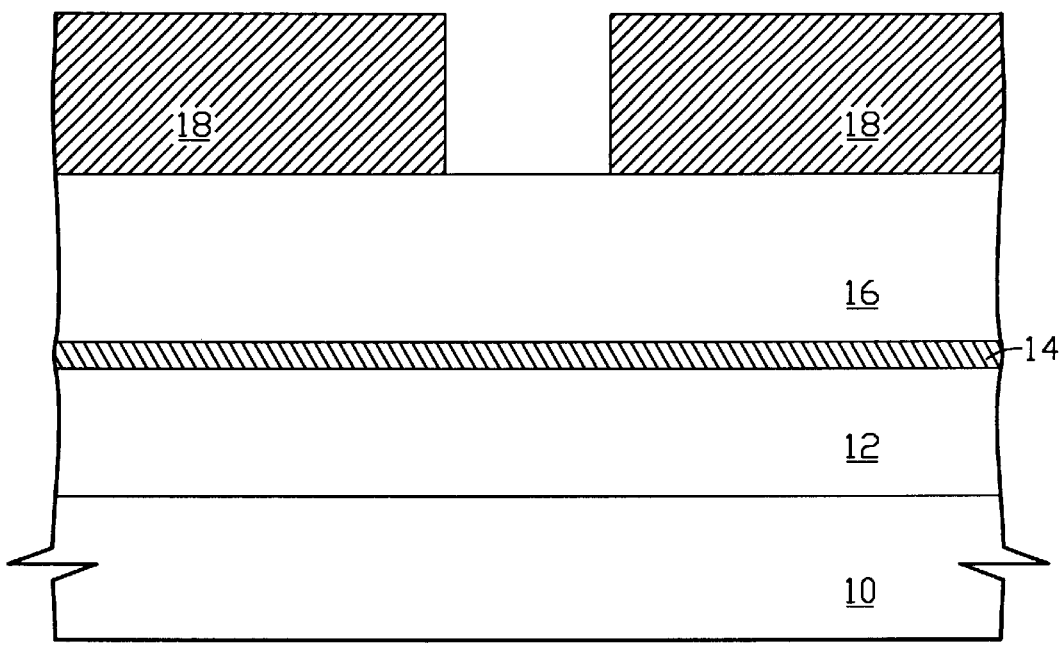
FIGS. 1A to 1E show cross-sectional views illustrative of various stages in the conventional low-K dual damascene.
Figure 1B:
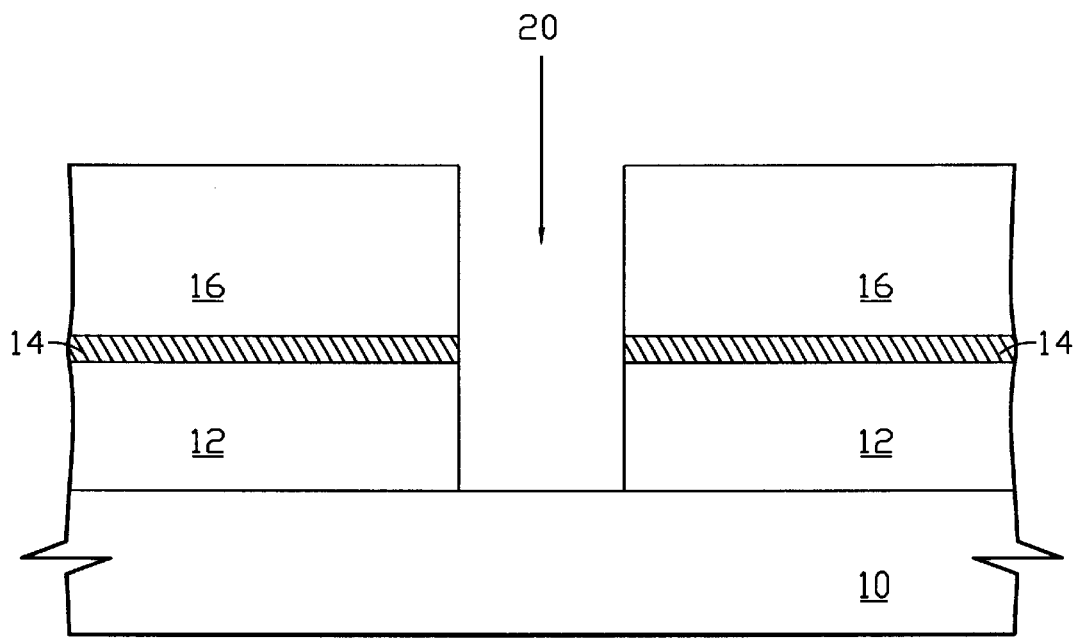
Figure 1C:
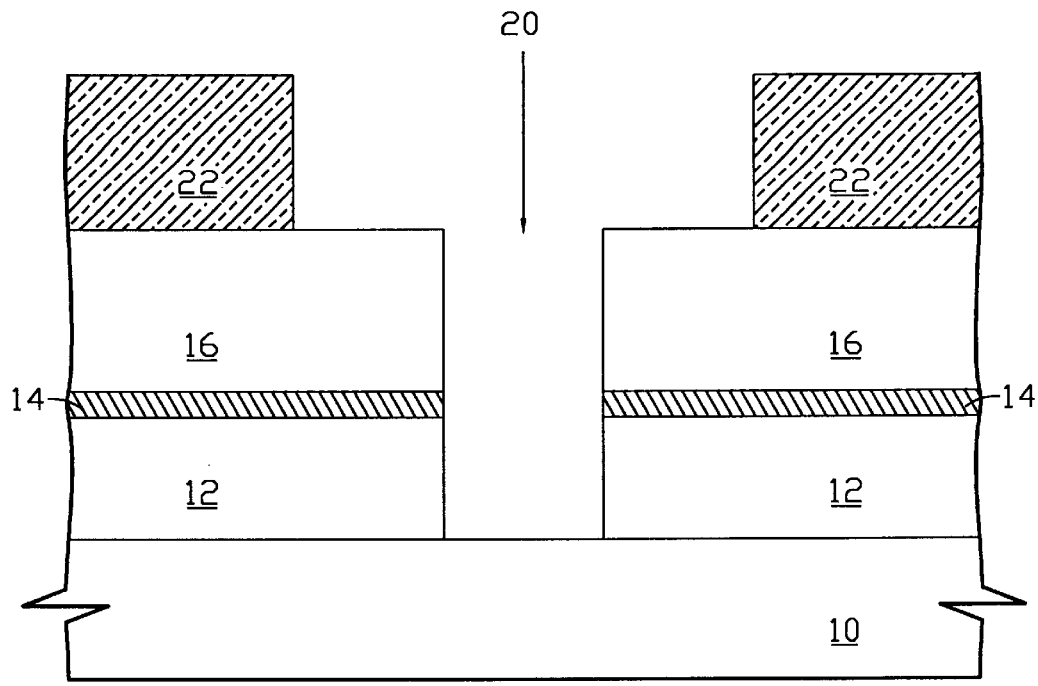
Figure 1D:
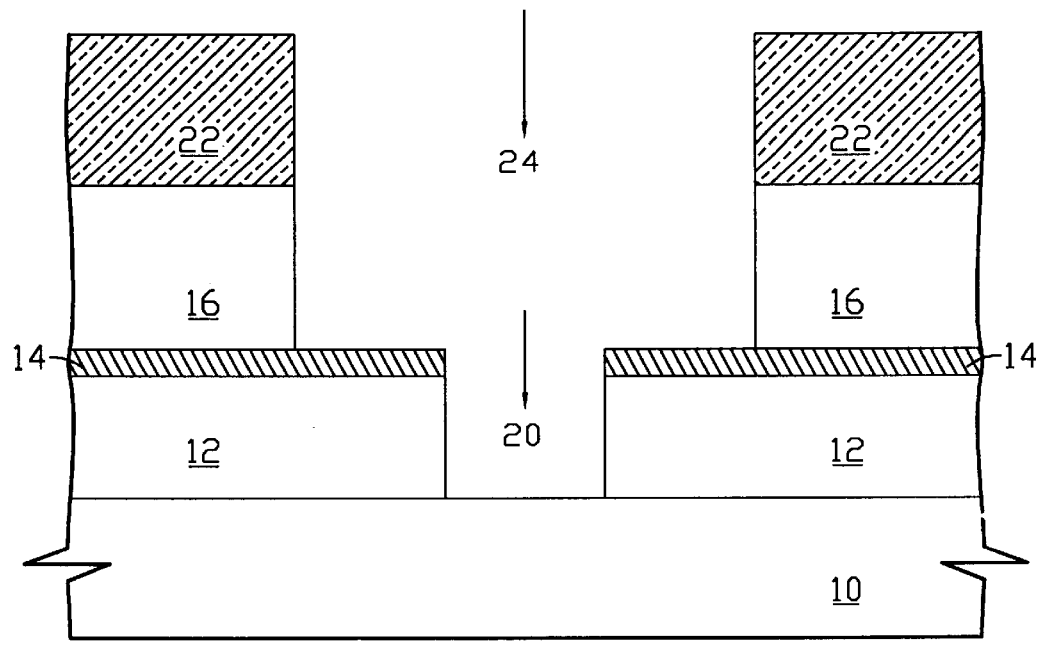
Figure 1E:
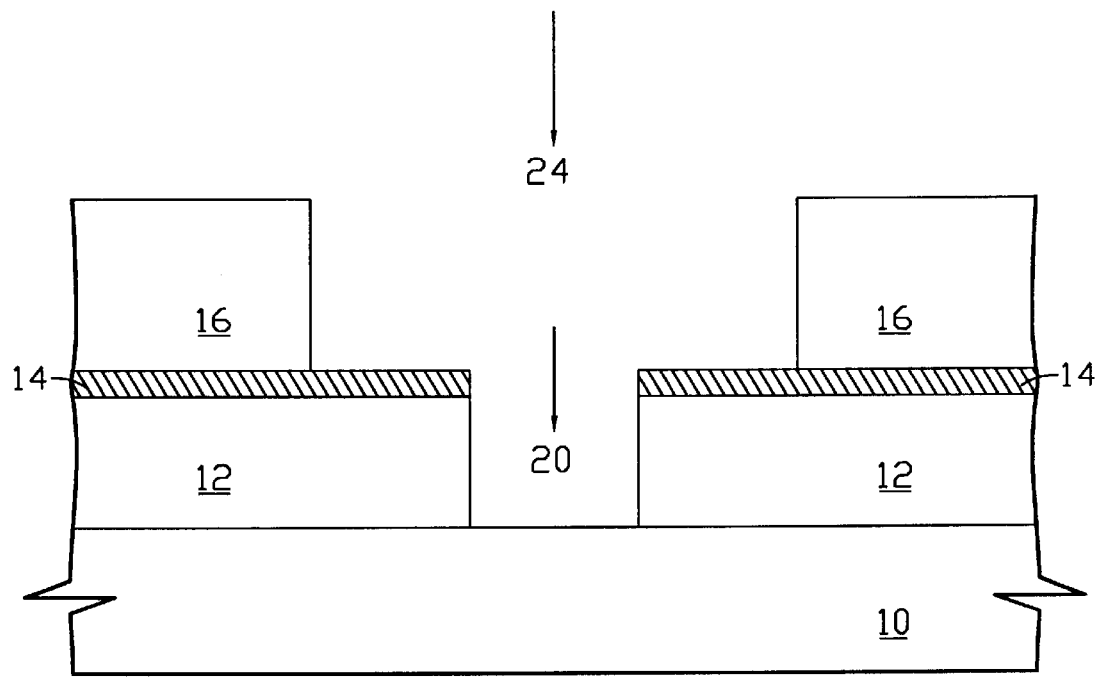
Figure 2A:
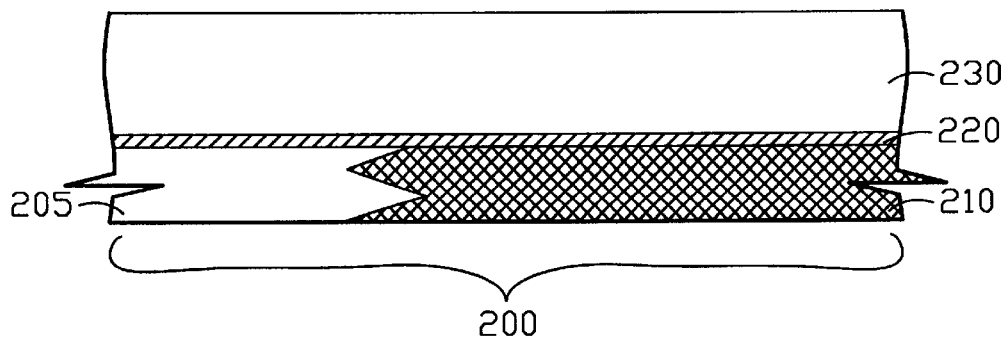
FIGS. 2A to 2J show cross-sectional views illustrative of various stages in the low-K dual damascene in accordance with one embodiment of the present invention.

As illustrated in FIG. 2A, a substrate 200 having copper conductible electricity layers 210 and dielectric layers 205 is provided. First, a copper diffusion barrier layer 220 is formed over the substrate 200 by deposition, and a first inter-metal dielectric 230 is formed over the diffusion barrier layer 220 by deposition. In this embodiment, the better material of the diffusion barrier layer 220 is composed of any dielectric material that can stop cupper diffusion, such as SiN and SiC; the better material of the first dielectric layer 230 is composed of dielectric material having low dielectric constant; and the better dielectric coefficient of the first dielectric layer 230 is about less than 3.5.

Figure 2B:
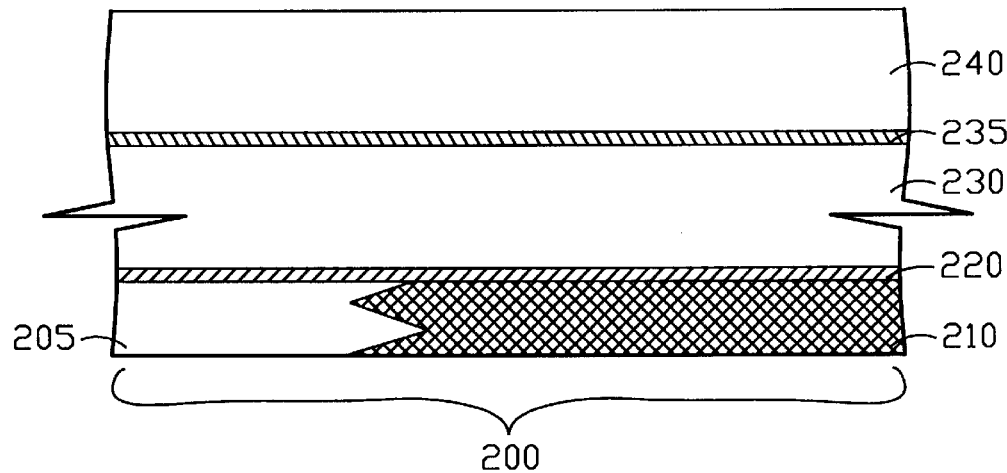
Figure 2C:
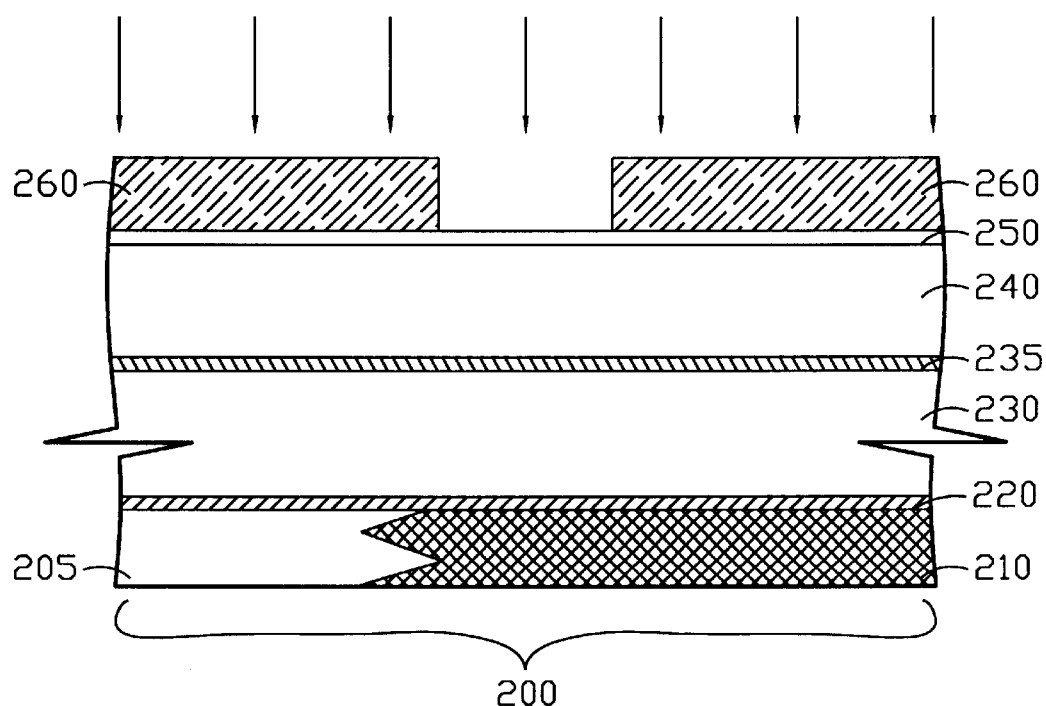

Referring to FIG. 2B, in this embodiment, A etching stop layer 235 and a second dielectric 240 are formed in turn over the first dielectric 230 by deposition. Next, a hard mask 250 is formed on the second dielectric 240. Then, a first photoresist layer 260 is formed over the hard mask 250, and defining the first photoresist layer 260 to be a deep pattern area, as shown in FIG. 2C. Wherein the better material of the etching stop layer 235 is composed of any material having a selectivity ratio that is greater than the selectivity ratio of the second dielectric 240, such as SiN, SiC and $SiO_2$; the better material of the second dielectric layer 240 is composed of dielectric material having low dielectric constant, the better material of the hard mask 250 is composed of any material having a selectivity ratio that is greater than the selectivity ratio of the second dielectric 240, such as SiN, SiC and $SiO_2$; and the better dielectric coefficient of the second dielectric layer 240 is composed of is about less than 3.5.

Figure 2D:
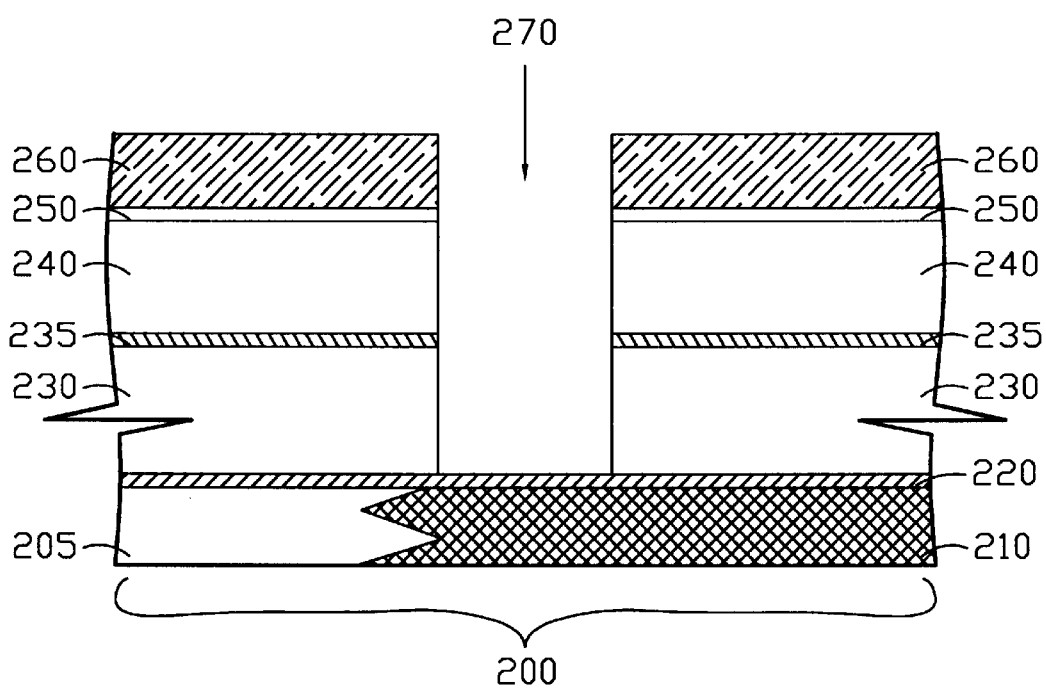

Referring to FIG. 2D, in this embodiment, dry etching of the deep pattern is carried out by means of the first photoresist layer 260 as the mask, and punch through in turn the hard mask 250, the second dielectric layer 240, the etch stop layer 235 and the first dielectric layer 230 to form a via hole 270.

Figure 2E:
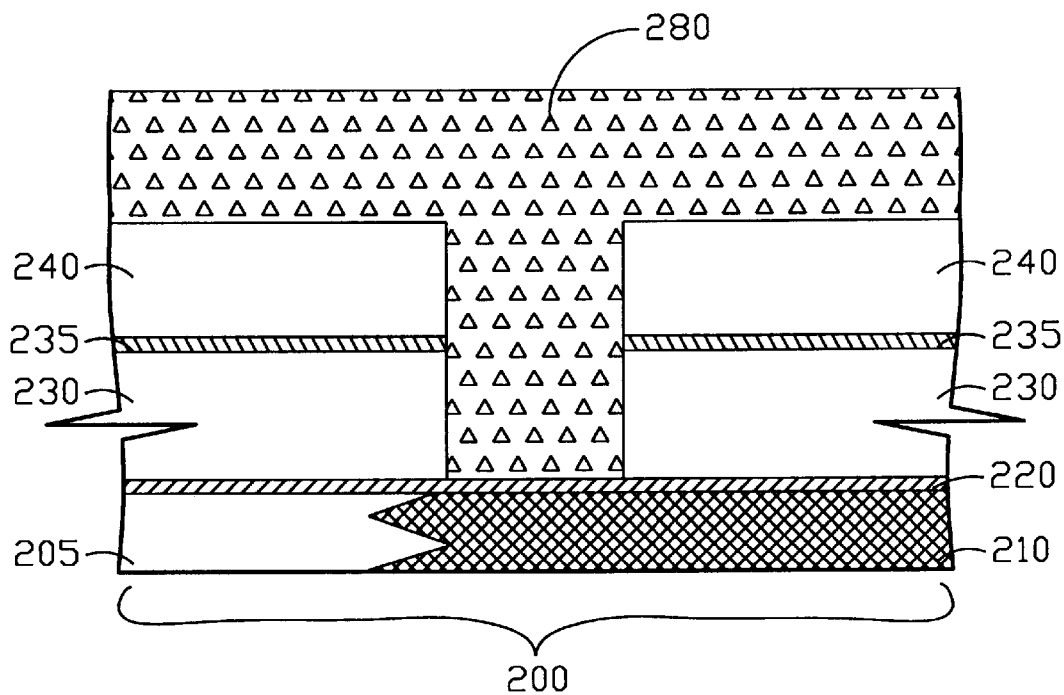

Referring to FIG. 2E, in this embodiment, the first photoresist layer 260 and the hard mask 250 are removed. A gap-filling material 280 (such as siloxane or methyl siloxane) is filled on the second dielectric 240 and into the via hole 270 by conventional partial-cured (or un-cured) spin-on glass method (P-SOG). Subsequently, carrying out the etching back to the gap-filling material 280, and expose the surface of the second dielectric 240 and gap-filling material 280.

Figure 2F:
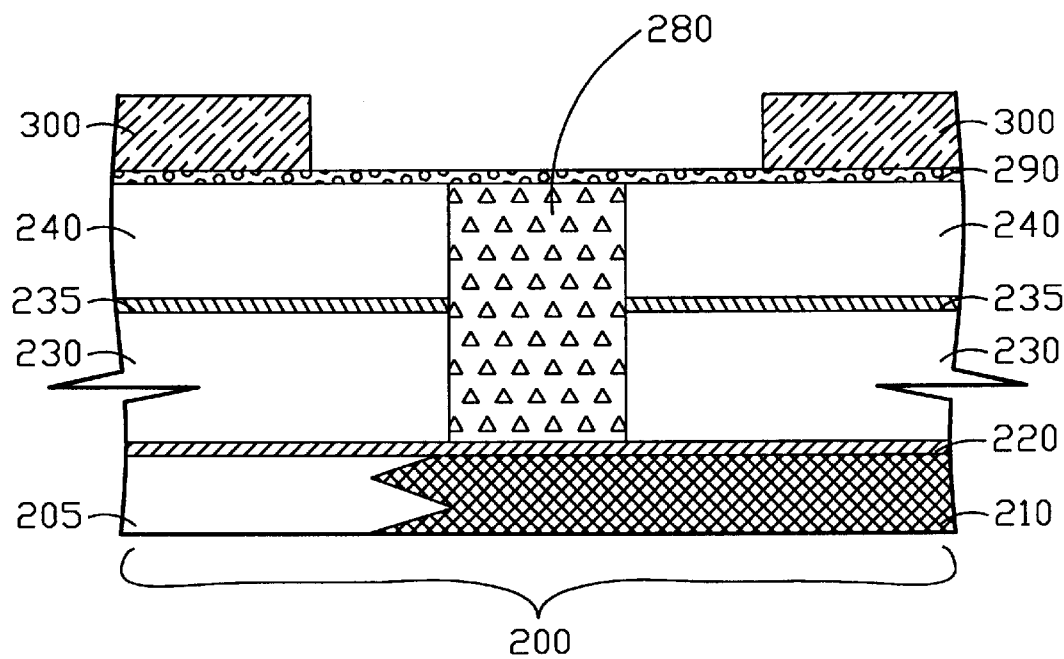

Referring to FIG. 2F, in this embodiment, a anti-reflection layer (ARL) 290 is formed over the second dielectric 240 by deposition with the anti-reflection coating (ARC) to prevent the glisten of the surface to influence accuracy of the photoresist layer exposure. In this embodiment, the second photoresist layer 300 is formed on the bottom anti-reflection coating (ARC) 290, and the second photoresist layer 300 is defined to form a shallow pattern area and to expose the partial surface of the via hole 270 and the bottom anti-reflection coating (ARC) 290.

Figure 2G:
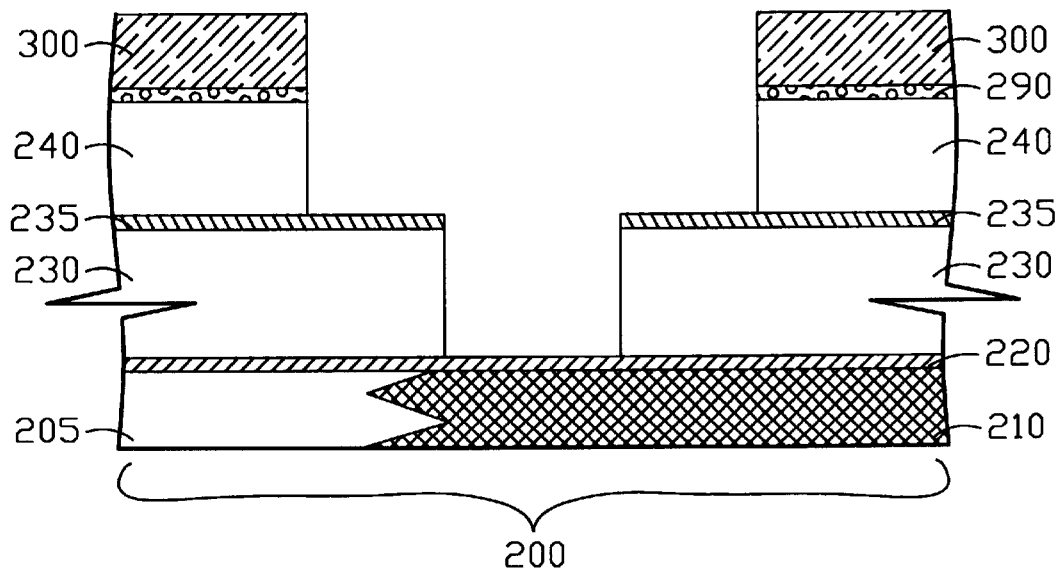

Referring to FIG. 2G, in this embodiment, dry etching of the shallow patterns is proceed by means of the second photoresist layer 300 as a mask, and etching stop layer 235 is as a etching terminal point to remove exposed partial surface of the bottom anti-reflection coating 290 so as to form a trench having large horizontal size. Then, the gap-filling material 280 is removed by wet etching that can use the aqueous organoamine solution or the buffered oxide etching solution.

Figure 2H:
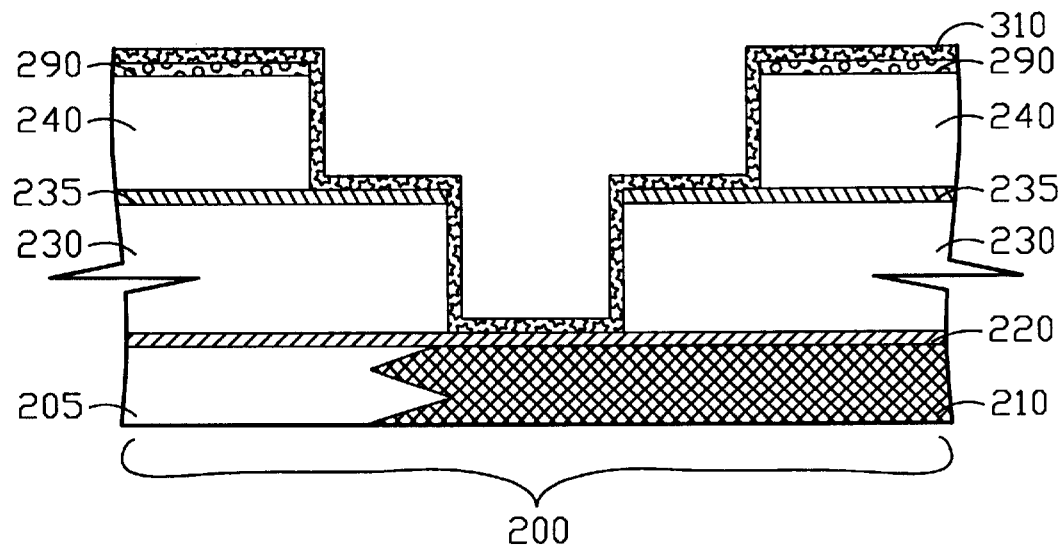

Referring to FIG. 2H, in this embodiment, the second photoresist layer 300 is removed to form the opening of the damascene. Then, a barrier layer 310 of the TaN is formed by conformal along the opening of the damascene and to extend over the surface of the second dielectric 240.

Figure 2I:
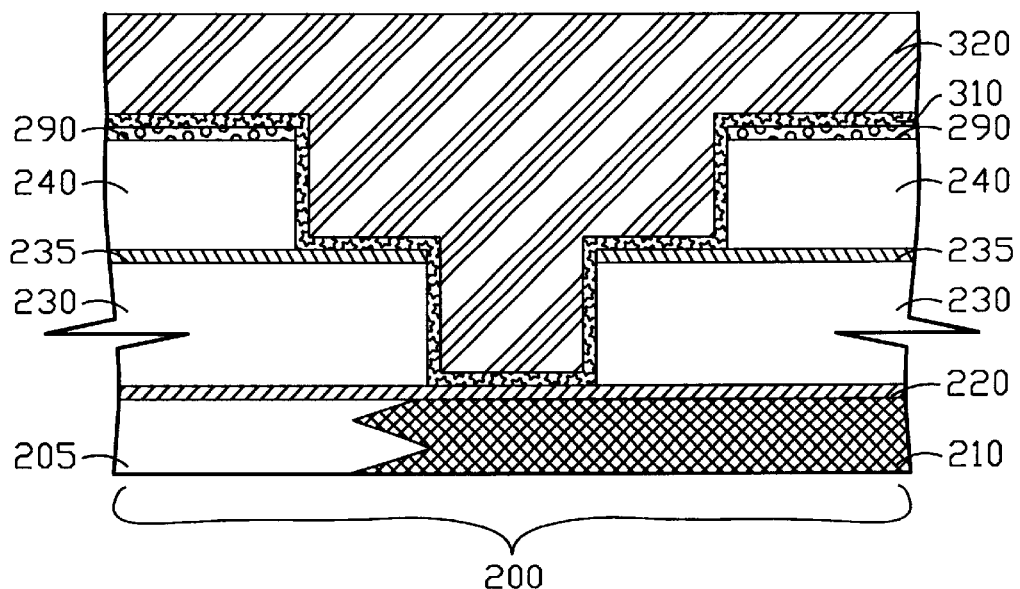
Figure 2J:
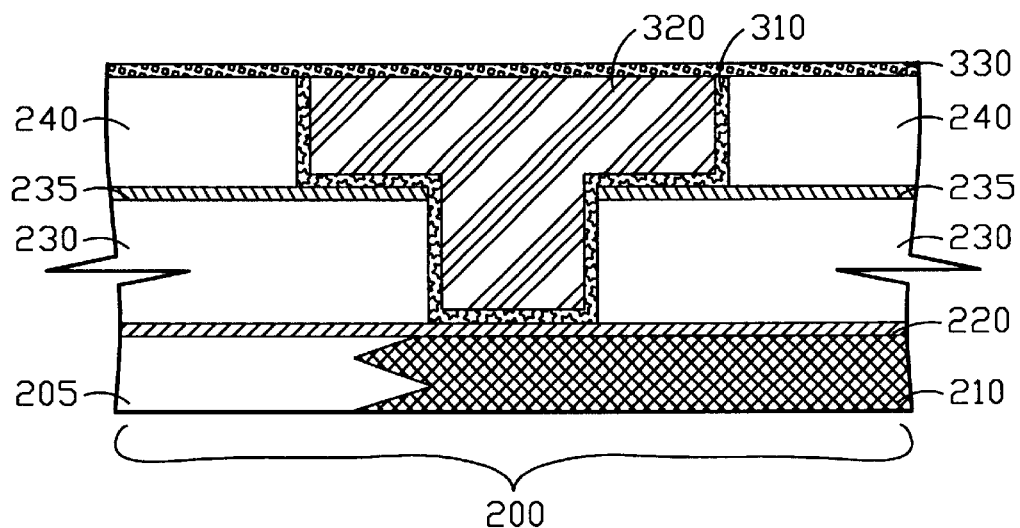

Referring to FIG. 2I, in this embodiment, proceeding a interconnect process: first, the seed layer is deposition on the barrier layer 310 of the TaN, and forming a copper conduct electricity metal layer 320 on the copper seed layer by means of electro-chemical deposition. Because the side walls and the bottom of the opening profile of the damascene have the seed layer in existence. The metal layer will can be selectively formed in the opening of the damascene, and only the partial metal layer extend to the surface of the second dielectric 240.

Referring to FIG. 2I, in this embodiment, a planarization process is carried out by chemical mechanical polishing (CMP)to remove the conduct electricity metal 320 on the second dielectric 240. And then, the barrier layer 310 of TaN and the bottom anti-reflection coating 290 are removed. Final, a barrier layer 330 of copper is deposition.

In this embodiment of the present invention, a method is provided for fabricating the low-K dual damascene integration skill. The method of the present invention can avoid photoresist residue that produced in the via hole by means of the gap-filling material is formed, and to avoid destroying low-K dielectric by means of the gap-filling material is formed while removing the photoresist layer and photoresist residue. The gap-filling material can fill into the via hole with partial-cured or un-cured spin-on glass method. Moreover, it can avoid long over etching the bottom of the via hole and destroying the desire conduct electricity area by means of the gap-filling material fill into the via hole, and the gap-filling material is easy to remove by dry etching or wet etching after trench etching. Hence, the present invention can efficiently arise quality of the process. Thus, the method of the present invention is easily and to conform to the economic effect. Method of the present invention is the best low-K dual damascene compatible process for deep sub-micro process.

Obviously, many modifications and variations of the present invention are possible in light of the above teachings. It is therefore to be understand that within the scope of the appended claims, the present invention may be practiced otherwise than as specifically described herein.

A preferred embodiment of the present invention will now be described in greater detail. Nevertheless, it should be recognized that the present invention can be practiced in a wide range of other embodiments besides those explicitly described, and the scope of the present invention is expressly not limited except as specified in the accompanying claims.

What is claimed is:

1. A method for forming a low-K dual damascene structure, comprising:
    providing a substrate;
    forming a barrier layer over said substrate;
    forming a first dielectric layer over said barrier layer;
    forming an etching stop layer over said first dielectric layer;
    forming a second dielectric layer over said etching stop layer;
    forming a hard mask over said second dielectric layer;
    forming a first photoresist layer having a first pattern on said hard mask;
    dry etching by using said first photoresist layer as a mask, and punching through in turn said hard mask, said second dielectric layer, said etching stop layer and said first dielectric layer to form a via hole;
    removing said first photoresist layer and said hard mask;
    filling a gap-filling material on said second dielectric and into said via hole;
    etching back said gap-filling material to expose surface of said second dielectric and said gap-filling material;
    forming an anti-reflection layer over said second dielectric and said gap-filling material;
    forming a second photoresist layer having a second pattern on said anti-reflection layer;
    dry etching said anti-reflection layer by using said second photoresist layer as a mask until stopping on said etching stop layer, thereby forming a trench having larger horizontal size than said via hole;
    removing said gap-filling material; and
    removing said second photoresist layer to form an opening of a damascene.

2. The method according to claim 1, wherein said first dielectric layer has a dielectric coefficient less than 3.5.

3. The method according to claim 1, wherein said second dielectric layer has a dielectric coefficient to be less than 3.5.

4. The method according to claim 1, wherein said gap-filling material comprises siloxane or methyl siloxane.

5. The method according to claim 1, wherein the step of forming said gap-filling material is partial-cured or un-cured spin-on glass method.

6. The method according to claim 1, wherein said gap-filling material is removed by a wet etching.

7. The method according to claim 6, wherein said wet etching step comprises an aqueous organoamine solution or a buffered oxide etching solution.

8. A method for forming low-K dual damascene, comprising:
    providing a substrate;
    forming a first barrier layer over said substrate;
    forming a first dielectric layer over said first barrier layer;
    forming an etching stop layer over said first dielectric layer;
    forming a second dielectric layer over said etching stop layer;
    forming a hard mask over said second dielectric layer;
    forming a first photoresist layer having a first pattern on said hard mask;
    dry etching by using said first photoresist layer as a mask, and punching through in turn said hard mask, said second dielectric layer, said etching stop layer and said first dielectric layer to form a via hole;
    removing said first photoresist layer and said hard mask;
    filling a gap-filling material on said second dielectric and into said via hole;
    etching back said gap-filling material to expose surface of said second dielectric and said gap-filling material;
    forming an anti-reflection layer over said second dielectric and said gap-filling material;
    forming a second photoresist layer having a second pattern on said anti-reflection layer;
    dry etching said anti-reflection layer by using said second photoresist layer as a mask until stopping on said etching stop layer, thereby forming a trench having larger horizontal size than said via hole;
    removing said gap-filling material;
    removing said second photoresist layer to form an opening of a damascene;

forming a conformal second barrier layer along said opening profile of said damascene and to extend over said surface of said second dielectric layer;

forming a seed layer on said second barrier layer with deposition;

forming a conduct electricity metal layer on said seed layer;

carrying out a planarization process to remove said conduct electricity metal on said second dielectric;

removing said second barrier layer on said second dielectric;

removing said anti-reflection layer on said second dielectric; and forming a third barrier layer on said second dielectric layer and said conduct electricity metal layer.

9. The method according to claim 8, wherein said first dielectric layer has a dielectric coefficient less than 3.5.

10. The method according to claim 8, wherein said second dielectric layer has a dielectric coefficient less than 3.5.

11. The method according to claim 8, wherein said gap-filling material comprises siloxane or methyl siloxane.

12. The method according to claim 8, wherein said gap-filling material is filled by partial-cured or un-cured spin-on glass method.

13. The method according to claim 8, wherein said gap-filling material is removed by a wet etching.

14. The method according to claim 13, wherein said wet etching comprises a aqueous organoamine solution or a buffered oxide etching solution.

15. The method according to claim 8, wherein said second barrier layer comprises tantalum nitride (TaN).

16. The method according to claim 8, wherein said seed layer comprises copper (Cu).

17. The method according to claim 8, wherein said conduct electricity metal layer comprises copper (Cu).

18. The method according to claim 8, wherein said conduct electricity metal layer is formed on said seed layer by electro-chemical deposition.

19. The method according to claim 8, wherein said planarization process is carried by chemical mechanical polish.

* * * * *